(12) United States Patent
Chang et al.

(10) Patent No.: US 8,576,098 B2
(45) Date of Patent: Nov. 5, 2013

(54) DEVICE AND METHOD FOR COMPRESSING FEATURE DESCRIPTOR

(75) Inventors: Yen-Chung Chang, Hsinchu (TW); Jiun-Yan Chen, Tuku Township, Yunlin County (TW); Hung-Hsiu Yu, Changhua (TW)

(73) Assignee: Industrial Technology Research Institute, Hsinchu (TW)

( * ) Notice: Subject to any disclaimer, the term of this patent is extended or adjusted under 35 U.S.C. 154(b) by 14 days.

(21) Appl. No.: 13/410,517

(22) Filed: Mar. 2, 2012

(65) Prior Publication Data

US 2012/0229311 A1    Sep. 13, 2012

(30) Foreign Application Priority Data

Mar. 7, 2011    (TW) .............................. 100107624 A (51) Int. Cl.
*H03M 7/30*        (2006.01)
(52) U.S. Cl.
USPC ................................. 341/87; 341/50; 341/51
(58) Field of Classification Search
USPC .............................................. 341/50, 51, 87
See application file for complete search history.

(56) References Cited

U.S. PATENT DOCUMENTS

| | | | |
|---|---|---|---|
| 6,711,293 B1 | 3/2004 | Lowe | |
| 2010/0020883 A1* | 1/2010 | Miyauchi et al. | 375/240.25 |
| 2010/0069576 A1 | 3/2010 | Schmotzer et al. | |
| 2010/0080469 A1 | 4/2010 | Liu et al. | |

FOREIGN PATENT DOCUMENTS

| | | |
|---|---|---|
| CN | 101493891 | 7/2009 |
| CN | 101630365 | 1/2010 |
| CN | 101661618 | 3/2010 |
| CN | 101697232 | 4/2010 |
| KR | 100848034 | 7/2008 |
| WO | WO 2009133856 | 11/2009 |

OTHER PUBLICATIONS

English language translation of abstract of KR 100848034 (published Jul. 23, 2008).
English language translation of abstract of CN 101493891 (published Jul. 29, 2009).
English language translation of abstract of WO 2009133856 (published Nov. 5, 2009).
English language translation of abstract of CN 101630365 (published Jan. 20, 2010).
English language translation of abstract of CN 101661618 (published Mar. 3, 2010).
English language translation of abstract of CN 101697232 (published Apr. 21, 2010).
Usui, Y., et al.; "The Sift Image Feature Reduction Method using the Histogram Intersection Kernel;" International Symposium on Intelligent Signal Processing and Communication Systems; Dec. 2009; pp. 517-520.
Mikolajczyk, K., et al.; "A Performance Evaluation of Local Descriptors;" IEEE Transactions on Pattern Analysis and Machine Intelligence; vol. 27; No. 10; Oct. 2005; pp. 1615-163.
Ke, Y., et al.; "PCA-SIFT: A More Distinctive Representation for Local Image Descriptors;" IEEE Computer Society Conference on Computer Vision and Pattern Recognition; 2004; pp. 1-8.

* cited by examiner

*Primary Examiner* — Jean B Jeanglaude
(74) *Attorney, Agent, or Firm* — McClure, Qualey & Rodack, LLP (57) ABSTRACT

A device for compressing a feature descriptor includes a non-uniform quantizer and a run-length encoder. The non-uniform quantizer accesses a source feature descriptor from a storage device, and non-uniformly quantizes the source feature descriptor having source vectors into an intermediate feature descriptor having intermediate vectors according to a vector default value. The run-length encoder executes run-length coding for the intermediate feature descriptor to generate a compressed feature descriptor.

17 Claims, 7 Drawing Sheets

DEVICE AND METHOD FOR COMPRESSING FEATURE DESCRIPTOR

This application claims the benefit of Taiwan application Serial No. 100107624, filed Mar. 7, 2011, the subject matter of which is incorporated herein by reference.

BACKGROUND

1. Technical Field

This disclosure relates in general to a compression method, and more particularly to a method and a device for compressing a feature descriptor.

2. Description of the Related Art

A feature descriptor is a descriptor, which can best represent a feature point, and may be obtained through various ways, such as scale invariant feature transform (SIFT) for performing Gaussian blur and subsample many times on an input image whose feature points are to be captured. Thereafter, an image difference between the input image and the blur image with the same resolution is performed to generate many octaves of difference of Gaussian (DoG). Next, the pixel with the maximum or minimum pixel value in the DoG image greater or smaller than the neighboring 26 pixel values is found according to the DoG image of the neighboring layers, and such the pixel point is a location where a feature point locates.

The SIFT creates a window according to the position of the image where the feature point is located after finding the location of the feature point, and calculates the intensity gradient vector between the neighboring two pixels in the block. Thereafter, statistics for the histogram of the gradient vector in the window is complied to find the peak gradient direction in the histogram, and this direction serves as the orientation of the feature point, and the subsequently generated vector direction of the feature descriptor is represented by an angle with respect to this orientation. Next, the window is cut into 4×4 subblocks, and the histogram of the gradient vector in each block is counted, wherein each histogram has eight gradient vector directions (8 bins), the value of each gradient vector direction is converted into a vector value of the feature descriptor after weighting and normalization. Thus, there are, in total, 4×4×8=128 feature descriptor vectors, which are also referred to as 128 sets of data, in the feature descriptor. Because each feature descriptor is composed of 128 sets of data, if the width of each set of data is 1 byte, each feature descriptor needs 128 bytes.

European Patent Number WO2009133856A1 discloses a method of creating an image database for object recognition, in which six smaller bits after the feature descriptor is quantized is omitted, and the representation is changed to two bits. U.S. Patent Publication No. US2010/080469A1 discloses a method of reducing the feature descriptor data, in which the feature descriptors of the gradient vectors of five sample points are adopted, and the number of the vectors of the feature descriptor is reduced from 128 to 40. Chinese Patent Number CN101661618A discloses a method for extracting and describing image features with turnover invariance, which mainly adopts a feature descriptor with extension covering 9 units to decrease the number of vectors of the feature descriptor from 128 to 83.

SUMMARY

This disclosure is directed to a method and a device for compressing a feature descriptor.

According to a first aspect of the present disclosure, a method for compressing a feature descriptor is provided. The method includes the steps of: accessing a source feature descriptor from a storage device; non-uniformly quantizing the source feature descriptor having a plurality of source vectors into an intermediate feature descriptor having a plurality of intermediate vectors according to a vector default value; and executing run-length coding for the intermediate feature descriptor to generate a compressed feature descriptor.

According to a second aspect of the present disclosure, a device for compressing a feature descriptor is provided. The device includes a non-uniform quantizer and a run-length encoder. The non-uniform quantizer accesses a source feature descriptor from a storage device, and non-uniformly quantizes the source feature descriptor having a plurality of source vectors into an intermediate feature descriptor having a plurality of intermediate vectors according to a vector default value. The run-length encoder executes run-length coding for the intermediate feature descriptor to generate a compressed feature descriptor.

The above and other aspects of the disclosure will become better understood with regard to the following detailed description of the non-limiting embodiment(s). The following description is made with reference to the accompanying drawings.

DETAILED DESCRIPTION

The following embodiments disclose a method and a device for compressing a feature descriptor. The method includes: accessing a source feature descriptor from a storage device; non-uniformly quantizing the source feature descriptor having a plurality of source vectors into an intermediate feature descriptor having a plurality of intermediate vectors according to a vector default value; and executing run-length coding for the intermediate feature descriptor to generate a compressed feature descriptor.

The device for compressing the feature descriptor includes a non-uniform quantizer and a run-length encoder. The non-uniform quantizer accesses a source feature descriptor from a storage device, and non-uniformly quantizes the source feature descriptor having a plurality of source vectors into an intermediate feature descriptor having a plurality of intermediate vectors according to a vector default value. The run-length encoder executes run-length coding for the intermediate feature descriptor to generate a compressed feature descriptor.

First Embodiment

Figure 1:
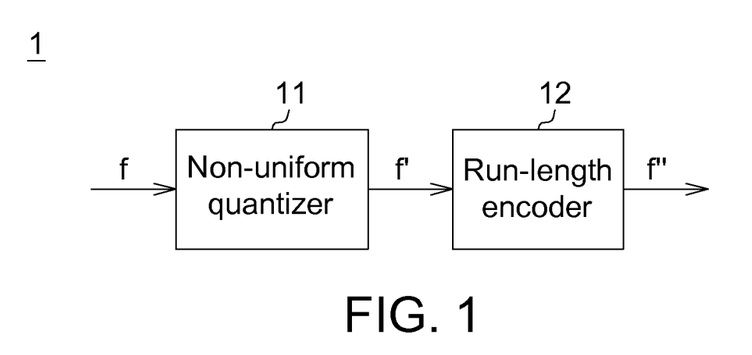
FIG. 1 is a schematic illustration showing a feature descriptor compressing device of a first embodiment.
Figure 2:
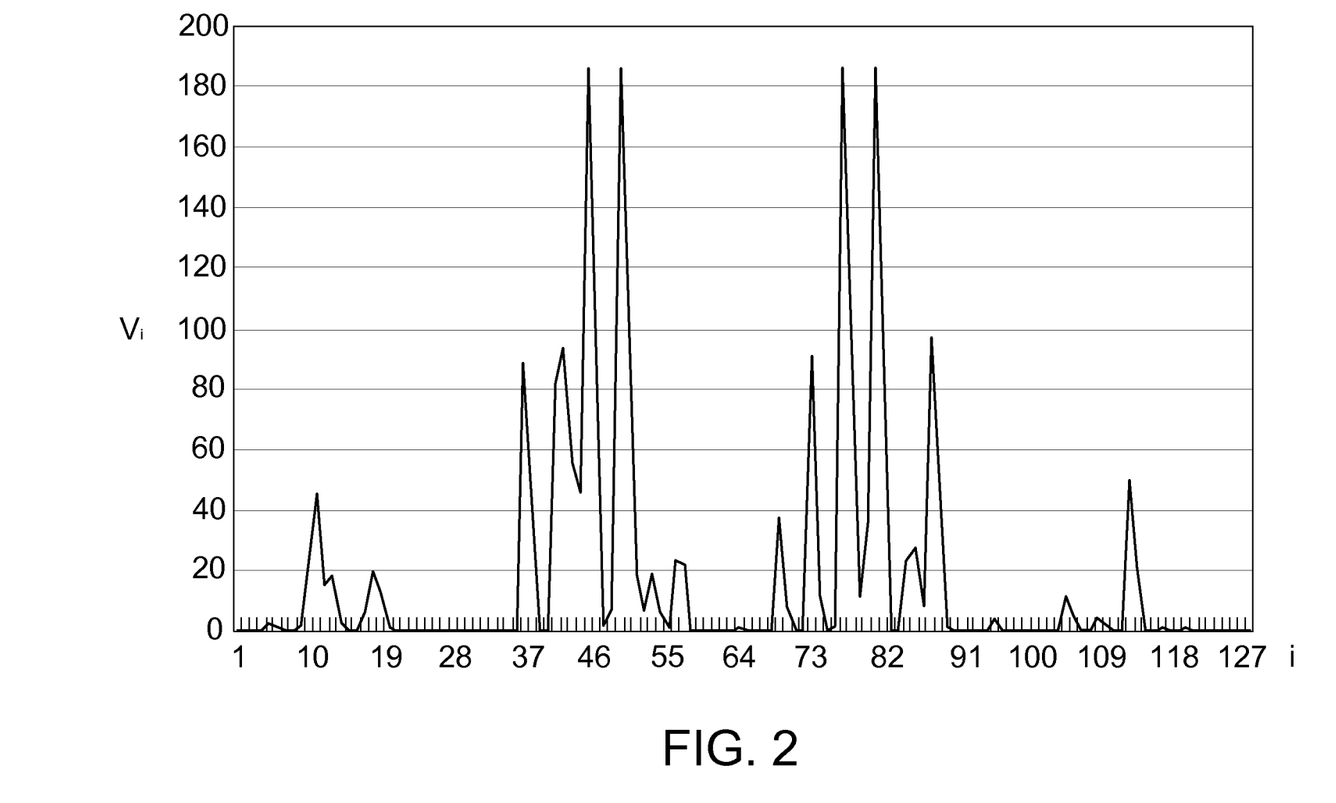
FIG. 2 is a schematic illustration of a source feature descriptor.
Figure 3:
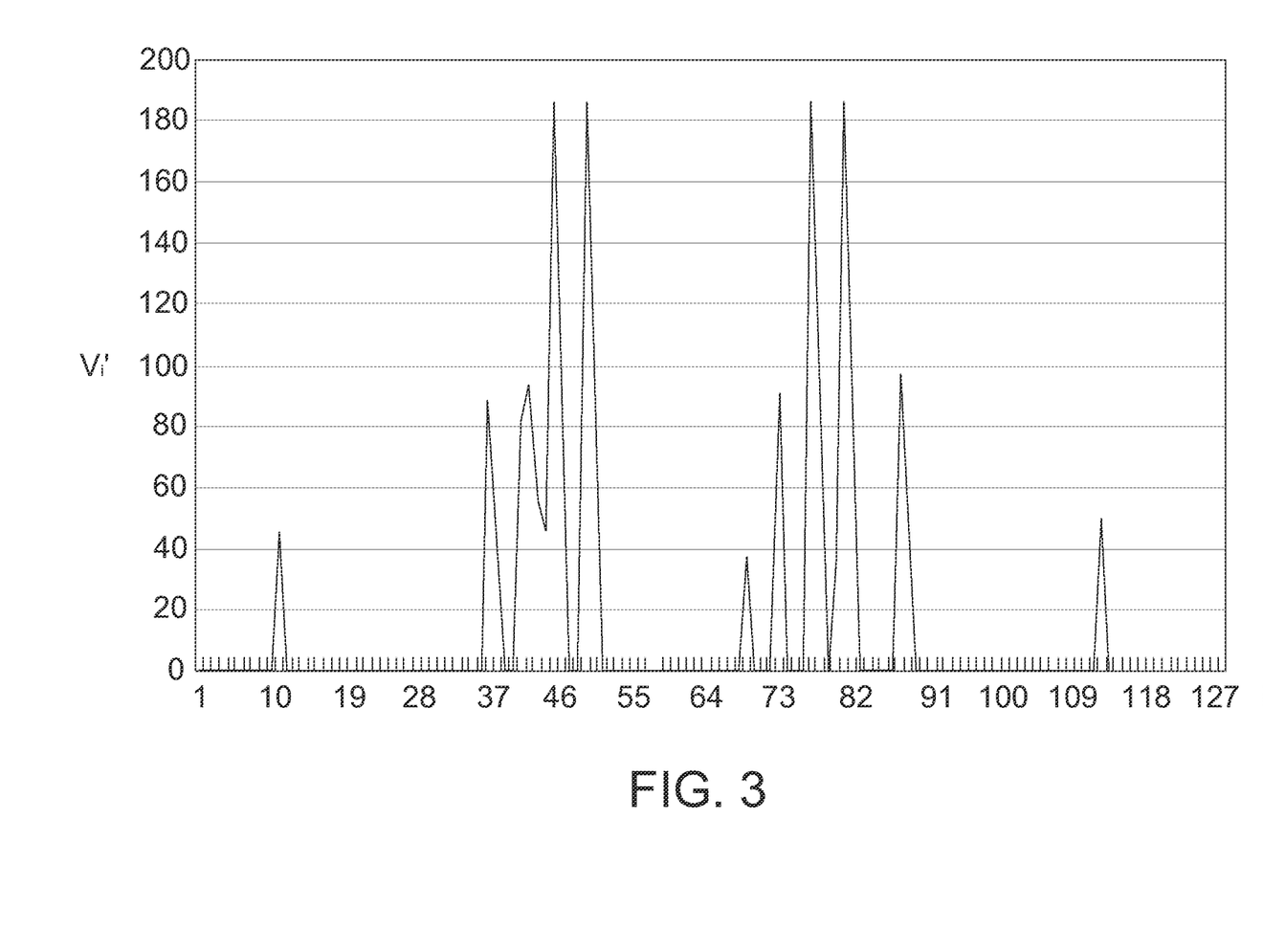
FIG. 3 is a schematic illustration of an intermediate feature descriptor.
Figure 4:
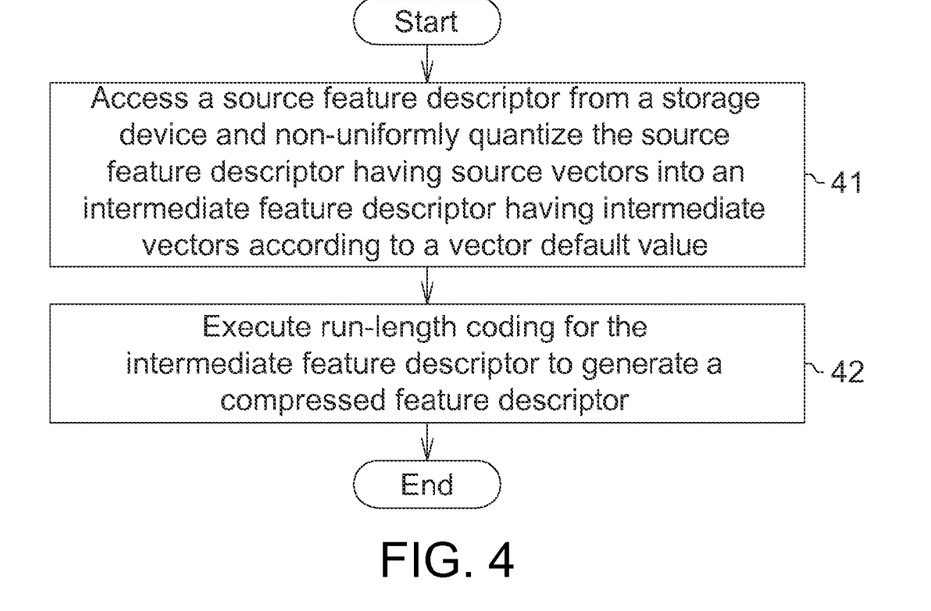
FIG. 4 is a flow chart of a feature descriptor compressing method.

Please refer to FIGS. 1 to 4. FIG. 1 is a schematic illustration showing a feature descriptor compressing device 1 of a first embodiment, FIG. 2 is a schematic illustration of a source feature descriptor, FIG. 3 is a schematic illustration of an intermediate feature descriptor, and FIG. 4 is a flow chart of a feature descriptor compressing method. The feature descriptor compressing method may be applied to the feature descriptor compressing device 1, which includes a non-uniform quantizer 11 and a run-length encoder 12. The non-uniform quantizer 11 and the run-length encoder 12 are implemented by, for example, a hardware circuit or software.

The feature descriptor compressing method includes the following steps. First, in a non-uniform quantizing step 41, the non-uniform quantizer 11 accesses a source feature descriptor D1 from a storage device, and non-uniformly quantizes a source feature descriptor f having source vectors $\{v_0, v_1, \ldots, v_{n-1}\}$ into an intermediate feature descriptor f' having intermediate vectors $\{v_0', v_1', \ldots, v_{n-1}'\}$ according to a vector default value. The storage device may be a memory, a memory card, or any medium capable of memorizing digital data. Next, in a run-length coding step 42, the run-length encoder 12 executes run-length coding for the intermediate feature descriptor f' to generate a compressed feature descriptor f".

Figure 5:
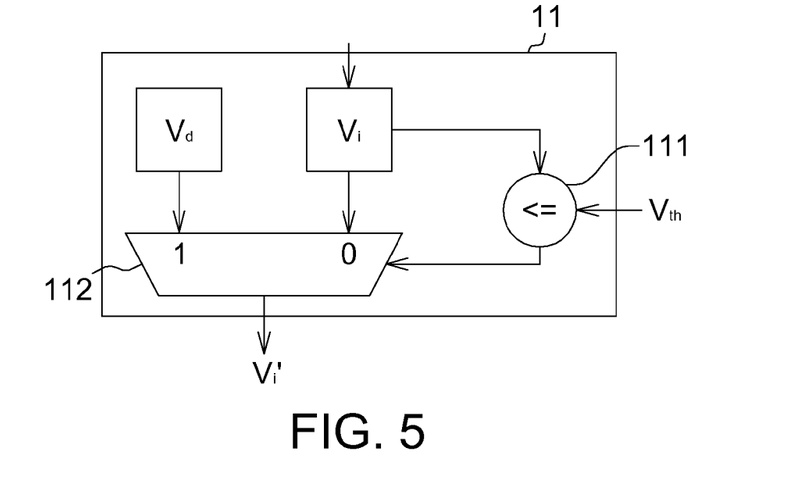
FIG. 5 is a schematic illustration of a non-uniform quantizer.
Figure 6:
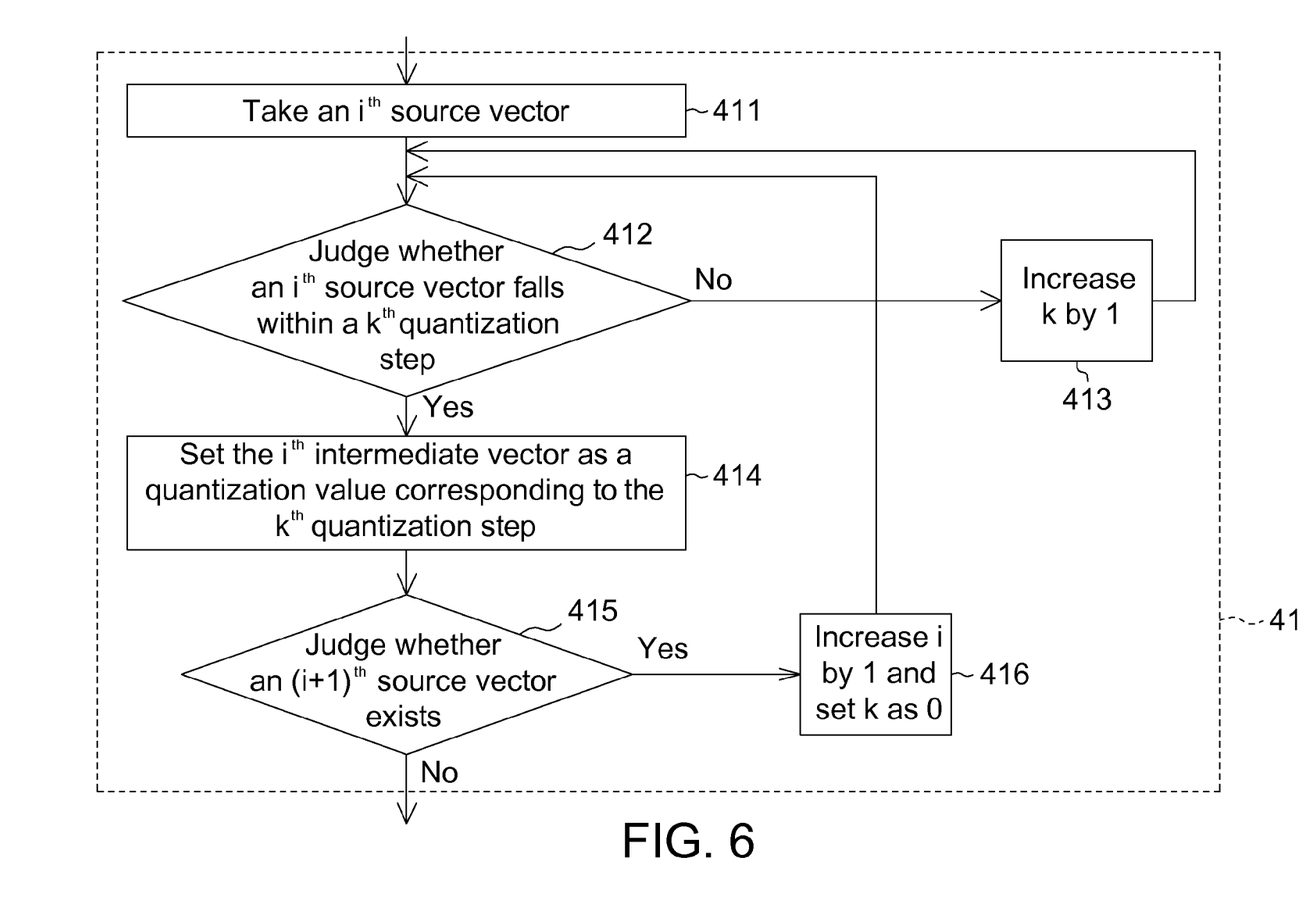
FIG. 6 is a detailed flow chart of a non-uniform quantizing step.

FIG. 5 is a schematic illustration of a non-uniform quantizer, and FIG. 6 is a detailed flow chart of the non-uniform quantizing step 41. As shown in FIGS. 5 and 6, the non-uniform quantizer 11 finds a quantization step corresponding to each source vector of the source feature descriptor, and outputs a quantization value corresponding to the quantization step. The non-uniform quantizer 11 further includes a comparator 111 and a multiplexer 112, and the step 41 further includes steps 411 to 416. First, as shown in the step 411, the non-uniform quantizer 11 takes the $i^{th}$ source vector $v_i$ of the source feature descriptor f, wherein i is a positive integer ranging from 0 to (n−1). Next, as shown in the step 412, the non-uniform quantizer 11 judges whether the $i^{th}$ source vector $v_i$ falls within the $k^{th}$ quantization step. When the $i^{th}$ source vector $v_i$ does not fall within the $k^{th}$ quantization step, the step 413 is executed. As shown in the step 413, the non-uniform quantizer 11 ascends k, and k is increased by 1, for example. The non-uniform quantizer 11 repeatedly executes the step 412 after ascending k. Therefore, the non-uniform quantizer 11 can find the quantization step corresponding to the $i^{th}$ source vector $v_i$. On the contrary, when the $i^{th}$ source vector $v_i$ falls within the $k^{th}$ quantization step, the step 414 is executed. As shown in the step 414, the non-uniform quantizer 11 sets the $i^{th}$ intermediate vector $v_i$ as the quantization value corresponding to the $k^{th}$ quantization step. The quantization value corresponding to the $k^{th}$ quantization step may also be referred to as a representative value $q_k$ of the $k^{th}$ quantization step. In other words, the representative value of the zeroth quantization step is $q_0$; the representative value of the first quantization step is $q_1$; and the representative value of the second quantization step is $q_2$, and so on.

In detail, the step 412 can further judge whether the $i^{th}$ source vector $v_i$ falls within the $k^{th}$ quantization step using the comparator 111 to compare the $i^{th}$ source vector $v_i$ with the vector default value $V_{th}$ to judge whether the $i^{th}$ source vector $v_i$ is not greater than the vector default value $V_{th}$. In the step 414, the multiplexer 112 selectively outputs the predetermined quantization value $V_d$ or the $i^{th}$ source vector $v_i$ as the $i^{th}$ intermediate vector $v_i'$ according to the comparison result of the comparator 111. When the $i^{th}$ source vector $v_i$ is not greater than the vector default value $V_{th}$, the quantization value outputted from the multiplexer 112 is equal to the predetermined quantization value $V_d$. When the $i^{th}$ source vector $v_i$ is greater than the vector default value $V_{th}$, the quantization value outputted from the multiplexer 112 is equal to the $i^{th}$ source vector $v_i$. In other words, when the $i^{th}$ source vector $v_i$ is not greater than the vector default value $V_{th}$, the $i^{th}$ intermediate vector $v_i'$ outputted from the multiplexer 112 is equal to the predetermined quantization value $V_d$. When the $i^{th}$ source vector $v_i$ is greater than the vector default value $V_{th}$, the $i^{th}$ intermediate vector $v_i'$ outputted from the multiplexer 112 is equal to the $i^{th}$ source vector $v_i$.

For example, if the value window of the source vector ranges between 0 and 255, then 226 quantization steps may be configured. If the vector default value $V_{th}$ and the predetermined quantization value $V_d$ are respectively set as 30 and 0, then the value window of the zeroth quantization step ranges from 0 to 30. The value windows of the $1^{st}$ to $225^{th}$ quantization steps are respectively configured as 31 to 255. For any source vector falling within the zeroth quantization step, the quantization value is 0. For the source vector falling within the first quantization step, the quantization value is 31; for the source vector falling within the $2^{nd}$ quantization step, the quantization value is 32, and so on.

As shown in FIGS. 2 and 3, the horizontal axis of FIG. 2 represents the vector number i, the vertical axis of FIG. 2 represents the vector value $v_i$, the horizontal axis of FIG. 3 represents the vector number i, and the vertical axis of FIG. 3 represents the intermediate vector number $v_i'$. If the vector default value $V_{th}$ is set as 30, then the $i^{th}$ intermediate vector $v_i'$ is equal to 0 when the $i^{th}$ source vector $v_i$ is smaller than or equal to 30. When the $i^{th}$ source vector $v_i$ is greater than 30, then the $i^{th}$ intermediate vector $v_i'$ is equal to the $i^{th}$ source vector $v_i$. Thus, the number of times of continuously appearing the same intermediate vector in the intermediate feature descriptor f' is greater than the number of times of continuously appearing the same source vector in the source feature descriptor f.

Figure 7:
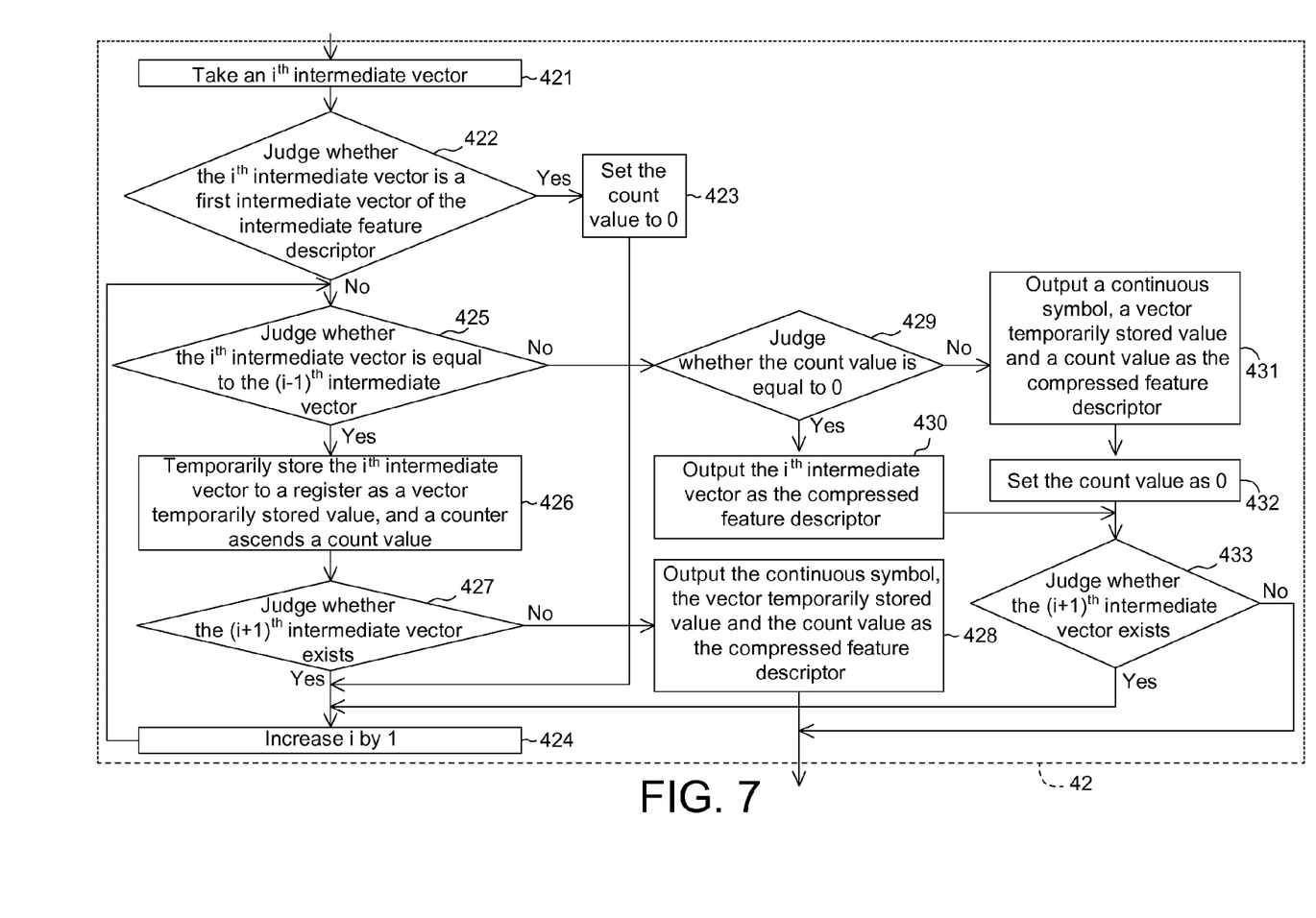
FIG. 7 is a schematic illustration of a run-length coding step.

The step 415 follows the step 414. As shown in the step 415, the non-uniform quantizer 11 judges whether the $(i+1)^{th}$ source vector $v_{i+1}$ exists. If the $(i+1)^{th}$ source vector $v_{i+1}$ exists, the step 416 is executed. As shown in the step 416, the non-uniform quantizer 11 ascends i and sets the k as 0, wherein i is increased by 1, for example. If the $(i+1)^{th}$ source vector $v_{i+1}$ does not exist, then the step 421 of FIG. 7 is executed. In other words, when the $(i+1)^{th}$ source vector $v_{i+1}$ does not exist, the non-uniform quantizing step 41 ends.

In addition to the steps 411 to 416, the non-uniform quantizing step may further include a debug step between the steps 412 and 413, and the non-uniform quantizer 11 judges whether the $(k+1)^{th}$ quantization step exists. If the $(k+1)^{th}$ quantization step does not exist, then a warming message is generated to notify the user of the error occurred in the non-uniform quantizing step. If the $(k+1)^{th}$ quantization step exists, then the step 413 is executed.

FIG. 7 is a schematic illustration of a run-length coding step. As shown in FIG. 7, the step 42 includes steps 421 to 433. First, as shown in the step 421, the run-length encoder 12 takes the $i^{th}$ intermediate vector $v_i'$ of the intermediate feature descriptor f'. Next, as shown in the step 422, the run-length encoder 12 judges whether the $i^{th}$ intermediate vector $v_i'$ is the first intermediate vector $v_0'$ of the intermediate feature descriptor f'. When the $i^{th}$ intermediate vector $v_i'$ is not the first intermediate vector $v_0'$ of the intermediate feature descriptor f', the step 425 is executed.

On the contrary, when the $i^{th}$ intermediate vector $v_i'$ is the first intermediate vector $v_0'$ of the intermediate feature descriptor f', the step 423 is executed. As shown in the step 423, the counter sets the count value to 0. Next, the step 424 is executed, wherein the run-length encoder 12 increases i by 1, for example, 1. Then, the step 425 is executed. As shown in the step 425, the run-length encoder 12 judges whether the $i^{th}$ intermediate vector $v_i'$ is equal to the $(i-1)^{th}$ intermediate vector $v_{i-1}'$. When the $i^{th}$ intermediate vector $v_i'$ is equal to the $(i-1)^{th}$ intermediate vector $v_{i-1}'$, the step 426 is executed. As shown in the step 426, the run-length encoder 12 temporarily stores the $i^{th}$ intermediate vector $v_i'$ to a register as a vector temporarily stored value, and the counter ascends the count value.

Next, as shown in the step 427, the run-length encoder 12 judges whether the $(i+1)^{th}$ intermediate vector exists. When the $(i+1)^{th}$ intermediate vector $v_{i+1}'$ exists, the step 424 is executed. On the contrary, when the $(i+1)^{th}$ intermediate vector $v_{i+1}'$ does not exist, the step 428 is executed. As shown in the step 428, when the $(i+1)^{th}$ intermediate vector $v_{i+1}'$ does not exist, the run-length encoder 12 outputs a continuous symbol, the vector temporarily stored value and the count value as the compressed feature descriptor f". After the step 428 is executed, the feature descriptor compressing method ends.

For example, when the intermediate feature descriptor f' continuously appears the intermediate vectors $v_1'$ to $v_{12}'$, which are all equal to 0, the continuous symbol outputted from the run-length encoder 12 is @, and the vector temporarily stored value and the count value are respectively equal to 0 and 12. Consequently, the continuously appeared intermediate vectors, which are the same, may be simplified as three sets of data including the continuous symbol, the vector temporarily stored value and the count value, so that the amount of data of the compressed feature descriptor f" can be reduced.

When the $i^{th}$ intermediate vector $v_i'$ is not equal to the $(i-1)^{th}$ intermediate vector $v_{i-1}'$, the step 429 is executed. As shown in the step 429, the run-length encoder 12 judges whether the count value is equal to 0. When the count value is not equal to 0, the step 431 is executed. As shown in the step 431, the run-length encoder 12 outputs the continuous symbol, the vector temporarily stored value and the count value as the compressed feature descriptor f". Next, as shown in the step 432, the run-length encoder 12 sets the count value as 0. Then, as shown in the step 433, the run-length encoder 12 judges whether the $(i+1)^{th}$ intermediate vector $v_{i+1}'$ exists. When the $(i+1)^{th}$ intermediate vector $v_{i+1}'$ exists, the step 424 is executed. On the contrary, when the $(i+1)^{th}$ intermediate vector $v_{i+1}'$ does not exist, the feature descriptor compressing method ends.

When the count value is equal to 0, the step 430 is executed. As shown in the step 430, the run-length encoder 12 outputs the $i^{th}$ intermediate vector as the compressed feature descriptor. Then, as shown in the step 433, the run-length encoder 12 judges whether the $(i+1)^{th}$ intermediate vector $v_{i+1}'$ exists. When the $(i+1)^{th}$ intermediate vector $v_{i+1}'$ exists, the step 424 is executed. On the contrary, when the $(i+1)^{th}$ intermediate vector does not exist, the feature descriptor compressing method ends.

Second Embodiment

Figure 8:
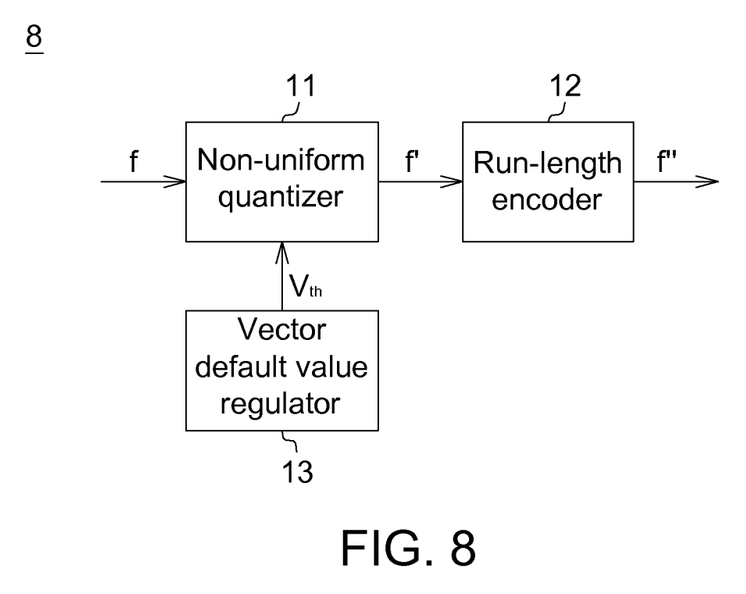
FIG. 8 is a schematic illustration showing a feature descriptor compressing device of a second embodiment.

FIG. 8 is a schematic illustration showing a feature descriptor compressing device 8 of a second embodiment. As shown in FIG. 8, the difference between the feature descriptor compressing devices 8 and 1 mainly resides in that the feature descriptor compressing device 8 further includes a vector default value regulator 13 for adaptively adjusting the vector default value $V_{th}$ according to the remaining memory capacity of the storage device. When the remaining memory capacity of the storage device is lower, the vector default value regulator 13 increases the vector default value $V_{th}$ to increase the compression ratio. On the contrary, when the remaining memory capacity of the storage device is higher, the vector default value regulator 13 decreases the vector default value $V_{th}$ to enhance the correctness of data.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for compressing a feature descriptor, the method comprising the steps of:
   accessing a source feature descriptor from a storage device;
   non-uniformly quantizing the source feature descriptor having a plurality of source vectors into an intermediate feature descriptor having a plurality of intermediate vectors according to a vector default value; and
   executing run-length coding for the intermediate feature descriptor to generate a compressed feature descriptor.

2. The method according to claim 1, further comprising the step of:
   adaptively adjusting the vector default value according to a remaining memory capacity of the storage device.

3. The method according to claim 1, wherein the step of non-uniformly quantizing comprises the steps of:
   taking an ith source vector of the source vectors;
   judging whether the ith source vector falls within a kth quantization step; and
   setting an ith intermediate vector of the intermediate vectors as a quantization value corresponding to the kth quantization step when the ith source vector falls within the kth quantization step,
   wherein i is a positive integer.

4. The method according to claim 3, wherein the step of judging whether the ith source vector falls within the kth quantization step judges whether the ith source vector is not greater than the vector default value.

5. The method according to claim 4, wherein in the step of setting the ith intermediate vector of the intermediate vectors as the quantization value corresponding to the kth quantization step,
   the quantization value is equal to a predetermined quantization value when the ith source vector is not greater than the vector default value; and
   the quantization value is equal to the ith source vector when the ith source vector is greater than the vector default value.

6. The method according to claim 1, wherein the step of executing the run-length coding comprises:
   judging whether an ith intermediate vector of the intermediate vectors is equal to an (i-1)th intermediate vector of the intermediate vectors; and
   temporarily storing the ith intermediate vector to a register as a vector temporarily stored value and ascending a count value when the ith intermediate vector is equal to the (i-1)th intermediate vector,
   wherein i is a positive integer.

7. The method according to claim 6, wherein the step of executing the run-length coding further comprises:
   outputting the ith intermediate vector as the compressed feature descriptor when the ith intermediate vector is not equal to the (i-1)th intermediate vector and the count value is equal to 0.

8. The method according to claim 7, wherein the step of executing the run-length coding further comprises:
outputting a continuous symbol, the vector temporarily stored value and the count value as the compressed feature descriptor when the ith intermediate vector is not equal to the (i−1)th intermediate vector and the count value is not equal to 0.

9. The method according to claim 7, wherein the step of executing the run-length coding further comprises:
outputting a continuous symbol, the vector temporarily stored value and the count value as the compressed feature descriptor when an (i+1)th intermediate vector of the intermediate vectors does not exist.

10. A device for compressing a feature descriptor, the device comprising:
a non-uniform quantizer for accessing a source feature descriptor from a storage device, and non-uniformly quantizing the source feature descriptor having a plurality of source vectors into an intermediate feature descriptor having a plurality of intermediate vectors according to a vector default value; and
a run-length encoder for executing run-length coding for the intermediate feature descriptor to generate a compressed feature descriptor.

11. The device according to claim 10, further comprising:
a vector default value regulator for adaptively adjusting the vector default value according to a remaining memory capacity of the storage device.

12. The device according to claim 10, wherein the non-uniform quantizer takes an ith source vector of the source vectors and judges whether the ith source vector falls within a kth quantization step, and when the ith source vector falls within the kth quantization step, the non-uniform quantizer sets an ith intermediate vector of the intermediate vectors as a quantization value corresponding to the kth quantization step;
wherein i is a positive integer.

13. The device according to claim 12, wherein the non-uniform quantizer comprises:
a comparator for judging whether the ith source vector is not greater than the vector default value; and
a multiplexer, wherein the quantization value outputted from the multiplexer is equal to a predetermined quantization value when the ith source vector is not greater than the vector default value, and the quantization value outputted from the multiplexer is equal to the ith source vector when the ith source vector is greater than the vector default value.

14. The device according to claim 10, wherein the run-length encoder judges whether an ith intermediate vector of the intermediate vectors is equal to an (i−1)th intermediate vector of the intermediate vectors, temporarily stores the ith intermediate vector to a register as a vector temporarily stored value when the ith intermediate vector is equal to the (i−1)th intermediate vector, and ascends a count value;
wherein i is a positive integer.

15. The device according to claim 14, wherein when the ith intermediate vector is not equal to the (i−1)th intermediate vector and the count value is equal to 0, the run-length encoder outputs the ith intermediate vector as the compressed feature descriptor.

16. The device according to claim 15, wherein when the ith intermediate vector is not equal to the (i−1)th intermediate vector and the count value is not equal to 0, the run-length encoder outputs a continuous symbol, the vector temporarily stored value and the count value as the compressed feature descriptor.

17. The device according to claim 15, wherein when an (i+1)th intermediate vector of the intermediate vectors does not exist, the run-length encoder outputs a continuous symbol, the vector temporarily stored value and the count value as the compressed feature descriptor.

* * * * *